(12) United States Patent
Karl

(10) Patent No.: US 11,049,483 B2
(45) Date of Patent: Jun. 29, 2021

(54) ACOUSTIC SENSOR HAVING A HOUSING AND A DIAPHRAGM ELEMENT SITUATED ON THIS HOUSING

(71) Applicant: Robert Bosch GmbH, Stuttgart (DE)

(72) Inventor: Matthias Karl, Ettlingen (DE)

(73) Assignee: Robert Bosch GmbH, Stuttgart (DE)

( * ) Notice: Subject to any disclaimer, the term of this patent is extended or adjusted under 35 U.S.C. 154(b) by 647 days.

(21) Appl. No.: 15/751,268

(22) PCT Filed: Jun. 27, 2016

(86) PCT No.: PCT/EP2016/064820
§ 371 (c)(1),
(2) Date: Feb. 8, 2018

(87) PCT Pub. No.: WO2017/032482
PCT Pub. Date: Mar. 2, 2017

(65) Prior Publication Data
US 2018/0240449 A1    Aug. 23, 2018

(30) Foreign Application Priority Data
Aug. 25, 2015    (DE) .......................... 102015216200.1

(51) Int. Cl.
*G10K 9/122*    (2006.01)
*G10K 9/22*    (2006.01)
(Continued)

(52) U.S. Cl.
CPC .............. *G10K 9/122* (2013.01); *G10K 9/22* (2013.01); *G10K 13/00* (2013.01); *H01L 41/187* (2013.01)

(58) Field of Classification Search
CPC .......... G10K 9/122; G10K 9/22; G10K 13/00; H01L 41/187; G06Q 10/10; G06Q 40/025;
(Continued)

(56) References Cited

U.S. PATENT DOCUMENTS 2,607,858 A    8/1952  Mason
3,247,927 A *  4/1966  Cragg .................... H04R 9/045
                                                          181/168
(Continued)

FOREIGN PATENT DOCUMENTS

DE    19744229 A1    4/1999
DE    19816456 C1    6/1999
(Continued)

OTHER PUBLICATIONS

International Search Report dated Sep. 20, 2016, of the corresponding International Application PCT/EP2016/064820 filed Jun. 27, 2016.

*Primary Examiner* — Isam A Alsomiri
*Assistant Examiner* — Amie M Ndure
(74) *Attorney, Agent, or Firm* — Norton Rose Fulbright US LLP; Gerard Messina

(57) ABSTRACT

An acoustic sensor, including a carrier element, a diaphragm element, which is situated on a first side of the carrier element, and an electroacoustic transducer, which is situated on a side of the diaphragm element facing the carrier element and is configured to induce at least a region of the diaphragm element to vibrate; at least an edge region, the diaphragm element having a retaining region, which extends in the direction of the carrier element and embraces a subregion of the carrier element.

21 Claims, 2 Drawing Sheets

(51) Int. Cl.
*G10K 13/00* (2006.01)
*H01L 41/187* (2006.01)

(58) Field of Classification Search
CPC .. G06Q 40/08; G06Q 30/018; G06Q 30/0278; G06Q 50/18; G06Q 50/26; G06Q 20/123; G06Q 10/02; G06Q 20/042; G06Q 20/385; G06Q 20/405; G06Q 30/02; G06Q 30/0251; G06Q 30/0273; G06Q 30/0277; G06Q 30/04; G06Q 30/0621; G06Q 30/0631; G06Q 30/0633; G06Q 40/02; G06Q 50/01; G06Q 50/163; G06Q 50/30; A61B 5/024; A61B 2562/0219; A61B 5/0022; A61B 5/0488; A61B 5/4836; A61B 5/686; A61B 5/0004; A61B 5/0015; A61B 5/0031; A61B 5/0205; A61B 5/04886; A61B 5/0492; A61B 5/1116; A61B 5/4561; A61B 5/4809; A61B 5/4818; A61B 5/682; A61B 5/7264; A61B 7/003; A61B 7/023; A61B 5/0006; A61B 5/486; A61B 5/0077; A61B 5/02405; A61B 5/02427; A61B 5/0476; A61B 5/1118; A61B 5/14539; A61B 5/7405; A61B 5/742; A61B 5/746; A61B 5/7475; A61B 7/00; A61B 17/00234; A61B 2090/374; A61B 2090/376; A61B 2090/3762; A61B 2090/378; A61B 2090/506; A61B 2560/0223; A61B 2560/0252; A61B 2562/0204; A61B 2562/0247; A61B 2562/0257; A61B 2576/023; A61B 34/32; A61B 5/01; A61B 5/02007; A61B 5/02055; A61B 5/021; A61B 5/02416; A61B 5/0261; A61B 5/029; A61B 5/0295; A61B 5/04; A61B 5/04005; A61B 5/0402; A61B 5/0408; A61B 5/0464; A61B 5/0468; A61B 5/0496; A61B 5/053; A61B 5/08; A61B 5/0816; A61B 5/0833; A61B 5/0836; A61B 5/091; A61B 5/107; A61B 5/1102; A61B 5/14546; A61B 5/1455; A61B 5/163; A61B 5/165; A61B 5/4514; A61B 5/4528; A61B 5/4806; A61B 5/4812; A61B 5/4839; A61B 5/4851; A61B 5/6802; A61B 5/6803; A61B 5/6813; A61B 5/6823; A61B 5/6824; A61B 5/7246; A61B 5/725; A61B 5/7282; A61B 5/74; A61B 5/7455; A61B 5/749; A61B 7/005; A61B 7/006; A61B 7/04; A61B 8/0875; A61B 90/10; H04W 4/80; H04W 4/38; H04W 4/026; H04W 84/12; H04W 84/18; H04W 24/06; H04W 24/08; H04W 24/10; H04W 4/021; H04W 4/027; H04W 4/029; H04W 4/06; H04W 4/40; H04W 4/50; H04W 48/60; H04W 76/10; H04W 76/14; H04W 8/005; G02B 2027/0178; G02B 27/0172; G02B 27/0093; G02B 2027/0138; G02B 2027/0174; G02B 26/0833; G02B 2027/0112; G02B 2027/014; G02B 26/10; G02B 26/101; G02B 26/105; G02B 27/0103; G02B 27/0176; G02B 27/1006; G02B 27/30; G02B 27/4227; G02B 27/4272; G02B 5/00; H04R 2201/003; H04R 3/005; H04R 17/02; H04R 19/04; H04R 29/004; H04R 19/005; H04R 19/02; H04R 1/02; H04R 1/10; H04R 1/083; H04R 1/326; H04R 1/406; H04R 2201/023; H04R 2201/405; H04R 2231/003; H04R 2420/07; H04R 2430/23; H04R 2460/01; H04R 2460/13; H04R 25/405; H04R 29/005; H04R 3/06; H04R 7/20; E21B 47/06; E21B 2200/20; E21B 33/037; E21B 43/0122; E21B 43/26; E21B 47/00; E21B 47/07; E21B 47/098; E21B 47/117; E21B 47/135; E21B 47/18; E21B 49/00; G01S 17/931; G01S 7/4863; G01S 15/931; G01S 17/10; G01S 17/36; G01S 17/86; G01S 17/894; G01S 7/4811; G01S 7/4815; G01S 7/4816; G01S 7/4817; G01S 7/484; G01S 7/4865; G01S 7/4914; G01S 7/497; G01S 7/527; G01S 7/536

See application file for complete search history.

(56) References Cited

U.S. PATENT DOCUMENTS

| | | | | |
|---|---|---|---|---|
| 3,586,792 A | * | 6/1971 | Gayford | H04R 7/12 29/594 |
| 3,655,502 A | * | 4/1972 | Yoshikawa | E04C 2/34 428/142 |
| 3,890,423 A | | 6/1975 | Zacharias, Jr. | |
| 3,943,388 A | | 3/1976 | Massa | |
| 3,946,422 A | * | 3/1976 | Yagi | H01G 7/025 257/254 |
| 4,559,257 A | * | 12/1985 | Nilsson | B32B 7/12 428/152 |
| 4,823,042 A | | 4/1989 | Coffey et al. | |
| 5,358,733 A | * | 10/1994 | Lur | H01L 23/5283 204/192.17 |
| 5,636,182 A | * | 6/1997 | Suzuki | G10K 9/122 310/337 |
| 6,276,212 B1 | | 8/2001 | Cooper et al. | |
| 6,374,676 B1 | * | 4/2002 | Arnold | G10K 9/122 310/324 |
| 6,940,659 B2 | * | 9/2005 | McLean | A61C 19/004 359/709 |
| 6,957,907 B2 | * | 10/2005 | Fischer | A61B 5/0088 362/16 |
| 7,287,327 B2 | * | 10/2007 | Ito | H04R 19/016 181/158 |
| 9,239,386 B2 | * | 1/2016 | Elian | H01L 41/0973 |
| 9,402,134 B2 | * | 7/2016 | Yang | H04R 7/02 |
| 10,793,419 B2 | * | 10/2020 | Fueldner | B81B 7/0077 |
| 2007/0013269 A1 | * | 1/2007 | Huang | B81B 3/0021 310/334 |
| 2012/0320713 A1 | * | 12/2012 | Mueller | G10K 9/122 367/141 |
| 2017/0154619 A1 | * | 6/2017 | Beckers | A61B 8/4483 |
| 2018/0031684 A1 | * | 2/2018 | Horishita | H04N 1/00074 |

FOREIGN PATENT DOCUMENTS

| | | | | |
|---|---|---|---|---|
| DE | 202007007135 U1 | * | 5/2007 | ............ G10K 9/122 |
| DE | 202007007135 U1 | | 8/2007 | |
| DE | 102006011155 A1 | | 9/2007 | |
| EP | 1986465 A1 | | 10/2008 | |
| JP | S5762491 U | | 4/1982 | |
| JP | S5941673 Y2 | | 12/1984 | |
| JP | S62112298 U | | 7/1987 | |
| JP | S63255680 A | | 10/1988 | |
| JP | H0711100 U | | 2/1995 | |
| KR | 20100063866 A | | 6/2010 | |

* cited by examiner

ACOUSTIC SENSOR HAVING A HOUSING AND A DIAPHRAGM ELEMENT SITUATED ON THIS HOUSING

FIELD

The present invention relates to an acoustic sensor.

BACKGROUND INFORMATION

In a typical design of an acoustic sensor, in particular, if the acoustic sensor is an ultrasonic sensor, a piezoceramic is typically bonded adhesively to a base of a cup-shaped housing. In this context, the base of the cup is constructed in such a manner, that it acts as a diaphragm.

Such a construction of an acoustic sensor is mostly justified in that the electroacoustic transducer and any associated electronics should be protected from environmental influences. In the case of such an ultrasonic sensor, this is ensured since the diaphragm is a subregion of the housing and the piezoceramic is situated in the interior of the housing.

However, in the case of the depicted construction of an ultrasonic sensor, there is little leeway with regard to a design of the housing and the diaphragm, since the diaphragm must be accessible, for example, via the interior of the housing, in order that the piezoceramic may be mounted to it. This stands in the way of, in particular, a development of especially flat acoustic sensors.

SUMMARY

An example acoustic sensor of the present invention includes a carrier element, a diaphragm element, which is situated on a first side of the carrier element, and an electroacoustic transducer, which is situated on a side of the diaphragm element facing the carrier element and is configured to induce at least a region of the diaphragm element to oscillate; at at least an edge region, the diaphragm element having a retaining region, which extends in the direction of the carrier element and embraces a subregion of the carrier element.

Since the retaining region of the diaphragm element embraces a subregion of the carrier element, this subregion is encircled by the retaining region. In other words, this means that sections of the retaining region of the diaphragm element are situated on different sides of the subregion of the carrier element. In particular, there is, in this case, a form-locked connection between the retaining region of the diaphragm element and the carrier element. Since the retaining region extends in the direction of the carrier element, the diaphragm has, in this context, a projecting rim.

In this manner, an acoustic sensor is provided, which allows a high degree of freedom in the design of the carrier element and simultaneously protects the electroacoustic transducer reliably from environmental influences. In addition, a combination of a fastener and the diaphragm is formed, through which a number of components necessary for producing the acoustic transducer is reduced.

Preferred further refinements of the present invention are described herein.

It is advantageous if the retaining region of the diaphragm element is resilient and forms a snap-on connection with the subregion of the carrier element. In this manner, particularly simple mounting of the diaphragm element on the carrier element is rendered possible. If desired, this may also be detached.

It is also advantageous if the subregion of the carrier element forms at least sections of a course of a thread and the retaining region of the diaphragm element includes a section, which is formed in such a manner, that it engages with the course of the thread. Consequently, the diaphragm element may be screwed onto the carrier element. In particular, a high degree of imperviousness and, therefore, a large protective effect with respect to environmental influences is provided by such a screw connection.

In addition, it is advantageous if the retaining region of the diaphragm element is made of a heat-shrinkable material and the diaphragm element is joined to the carrier element by heating the diaphragm element. In particular, in this context, the diaphragm element is joined to the carrier element by heating the retaining region. In other words, the diaphragm element is shrunk onto the carrier element. Such a connection between the diaphragm element and the carrier element has a high degree of imperviousness. In addition, it is particularly simple to carry out the manufacturing of such an acoustic sensor, since in the case of such an acoustic sensor, there is a high error tolerance with regard to manufacturing variation at the diaphragm element and at the carrier element.

It is advantageous if the diaphragm element is at least partially elastic and its dimension is selected, so that when the retaining region is embraced by the diaphragm element, there is contact pressure between the retaining region and the carrier element. Consequently, this ensures a high degree of imperviousness of the acoustic sensor at a transition between the diaphragm element and the carrier element.

It is also advantageous if the carrier element has a cavity, which is situated on a side of the carrier element that is covered by the diaphragm element. The cavity forms, in particular, a reflection region, by which acoustic signals emanating from the diaphragm element are reflected and reverberated back in a primary transmitting direction of the acoustic sensor. This allows a directivity characteristic of the acoustic sensor to be formed. In addition, this provides a free space for vibration of the diaphragm element.

It is also advantageous if the carrier element is a circuit board. Consequently, further electronic components of the acoustic sensor may be situated directly on the carrier element. A particularly simple and flat construction of the acoustic sensor is provided.

In addition, it is advantageous if the carrier element includes a receptacle on a side of the carrier element facing away from the diaphragm element, electronics for exciting the electroacoustic transducer being situated in the receptacle. Therefore, the carrier element is used as a housing. Since the electronics are situated on a side of the carrier element facing away from the diaphragm element, a surface pattern of the electronics is prevented from influencing sound propagation in the acoustic sensor.

Furthermore, it is advantageous if a sealing element is situated between the side of the diaphragm element facing the carrier element, and the carrier element. In particular, the sealing element is formed in one piece with the diaphragm element or the carrier element, using a two-component injection molding method. Consequently, a particularly tightly-sealed acoustic sensor is produced.

It is equally advantageous if the carrier element includes a cavity in the retaining region, the sealing element being situated in the cavity. In this context, the sealing element preferably includes a lip, which seals a transition between the carrier element and the diaphragm element. This therefore ensures a particularly well-sealed transition between the carrier element and the diaphragm element.

BRIEF DESCRIPTION OF THE DRAWINGS

Exemplary embodiments of the present invention are described in detail below, with reference to the figures.

DETAILED DESCRIPTION OF EXAMPLE EMBODIMENTS

Figure 1:
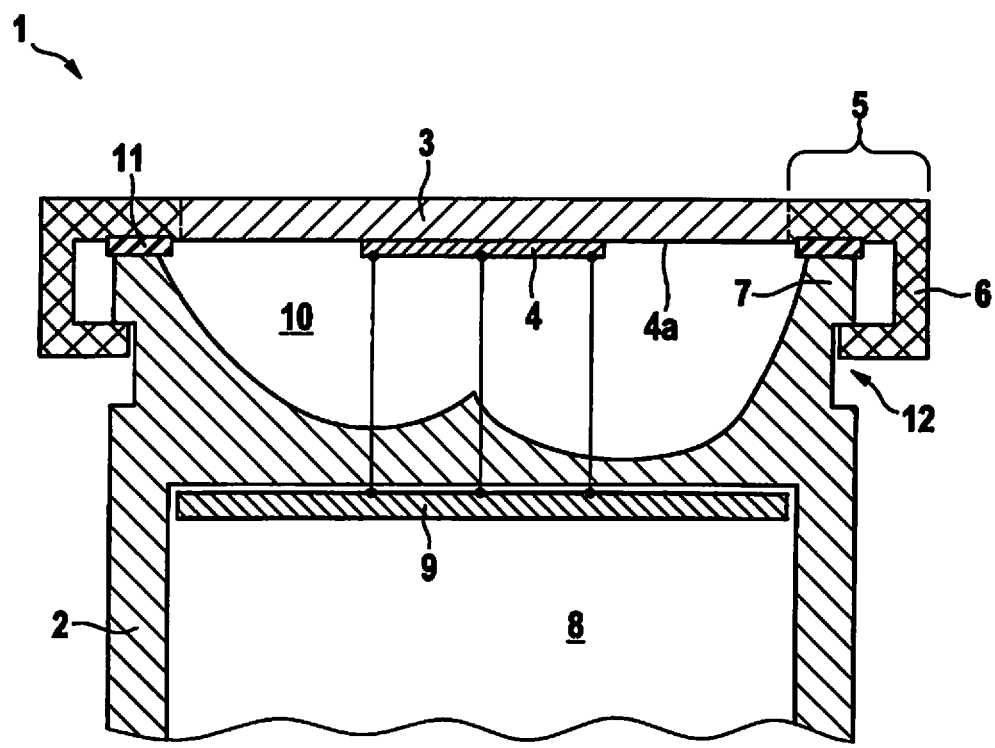
FIG. 1 shows a schematic view of an acoustic sensor in a first specific embodiment of the present invention.

FIG. 1 shows a schematic view of an acoustic sensor 1 according to a first specific embodiment of the present invention. A cross section of acoustic sensor 1 is shown. Acoustic sensor 1 includes a carrier element 2, a diaphragm element 3 and an electroacoustic transducer 4.

In this first specific embodiment, carrier element 2 has, as a basic form, the shape of a solid cylinder. On a first side and on a second side, which is opposite to the first side of carrier element 2, this solid cylinder has, in each instance, a disk-shaped surface. A surface of the solid cylinder and, consequently, of carrier element 2, which joins the first side and the second side, is referred to as a circumferential surface.

A cavity 10 is introduced on the first side of carrier element 2, therefore, on one of the disk-shaped surfaces of the solid cylinder. In this context, cavity 10 extends on the first side of carrier element 2 in such a manner, that a rib remains, which forms an edge region of the surface situated on the first side of carrier element 2. As is apparent in FIG. 1, cavity 10 may have a variable depth over its course along the first side of carrier element 2. Thus, in the first specific embodiment shown in FIG. 1, cavity 10 is a circular depression, which runs around a center of the first side of carrier element 2. The depth changes both over a radius of the first side and along a circular direction of the first side, that is, azimuthally. Thus, on a left side of carrier element 2, in the cross section shown in FIG. 1, the cavity 10 in this first specific embodiment has a depth different from a right side. Therefore, acoustic waves, which are reflected in these different regions of cavity 10, cover different distances. Consequently, a directivity characteristic of acoustic sensor 1 is influenced.

A receptacle 8 is introduced into carrier element 2 on the second side of carrier element 2, which is opposite to the first side of carrier element 2. Receptacle 8 may be a blind hole, which is introduced into the second side of carrier element 2 and extends along a cylinder axis of carrier element 2. Therefore, this section of carrier element 2 may be considered a hollow cylinder. Between the cavity 10 introduced on the first side of carrier element 2, and receptacle 8, there is a region of the carrier element, which separates cavity 10 and receptacle 8 from each other.

The circumferential surface of carrier element 2 includes a constriction 12. Constriction 12 is a region, in which a radius of the solid cylinder, which forms the basic shape of carrier element 2, is reduced. Constriction 12 is positioned in a region of the circumferential surface in such a manner, that a distance to the first side is greater than zero.

A diaphragm element 3 is situated on the first side of carrier element 2. Diaphragm element 3 is a flexible element, which includes a retaining region 6 at least an edge region 5, the retaining region extending in the direction of carrier element 2 and embracing a subregion 7 of carrier element 2. In this context, all or part of diaphragm element 3 may be flexible.

Diaphragm element 3 covers the first side of carrier element 2 and is shaped flat in this region, in which it covers the first side. Diaphragm element 3 includes retaining region 6 in edge region 5 of diaphragm element 3. In this first specific embodiment, retaining region 6 is formed such that at its outer circumference, diaphragm element 3 extends along carrier element 2, parallel to the cylinder axis of carrier element 2; and after a distance, which extends at least to constriction 12, the diaphragm element extends, in turn, parallel to the surface covering carrier element 2, in the direction of a center of carrier element 2, thus, inward. In this context, retaining region 6 of diaphragm element 3 extends at least so far in the direction of the center of carrier element 2, that it reaches into constriction 12. Consequently, the cross section of retaining region 6 forms a U-shape, which is also evident in FIG. 1 in edge region 5 of diaphragm element 3.

Therefore, carrier element 2 has a subregion 7, which is embraced by diaphragm element 3. In particular, the region of carrier element 2, which is situated between constriction 12 and the first side of carrier element 2, belongs to this subregion 7. Consequently, carrier element 2 includes a region, in which in each instance, a section of diaphragm element 3 is situated on two opposite sides.

Electroacoustic transducer 4 is situated on a side 4a of diaphragm element 3 facing carrier element 2. Electroacoustic transducer 4 is a disk-shaped element and is situated at a center of the surface of diaphragm element 3, which covers the first side of carrier element 2.

Electroacoustic transducer 4 is configured to induce at least a region of diaphragm element 3 to vibrate. In this first specific embodiment, electroacoustic transducer 4 is welded to diaphragm element 3. However, in alternative specific embodiments, diaphragm element 3 may also be fixed in position at carrier element 2 and only be in loose contact with diaphragm element 3. In this first specific embodiment, electroacoustic transducer 4 is a piezoelectric element. This may be induced to move mechanically by applying an electrical signal.

Electronics 9, which supply this electrical signal on request and are therefore suitable for exciting electroacoustic transducer 4, are situated in receptacle 8 of carrier element 2. Consequently, electronics 9 are situated inside of carrier element 2, which means that this may be regarded as a housing. Electronics 9 are connected to electroacoustic transducer 4 by a plurality of electrical leads.

As described above, diaphragm element 3 covers carrier element 2 on the first side. In so doing, in this first specific embodiment, diaphragm element 3 does not rest directly on carrier element 2, but lies on a sealing element 11, which is situated between the side 4a of the diaphragm element facing carrier element 2, and carrier element 2. In this first specific embodiment, sealing element 11 is a ring, which is made of an elastic material and rests on the first side of carrier element 2. In this context, an inner circumference and an outer circumference of sealing element 11 are selected such that it rests in a region of carrier element 2, which is situated outside of cavity 10. Therefore, sealing element 11 lies on the ridge, which is situated between cavity 10 and the circumferential surface of the carrier element. Consequently, the imperviousness of acoustic sensor 1 in a transition region between carrier element 2 and diaphragm element 3 is improved. In alternative specific embodiments, the sealing element is omitted.

An inner dimension of diaphragm element 3 is preferably smaller than an outer dimension of carrier element 2. In this context, it is advantageous if diaphragm element 3 is at least partially elastic. Therefore, the dimension of diaphragm element 3 is selected so that when retaining region 6 is embraced by diaphragm element 3, there is a contact pressure between retaining region 6 and carrier element 2.

Figure 2:
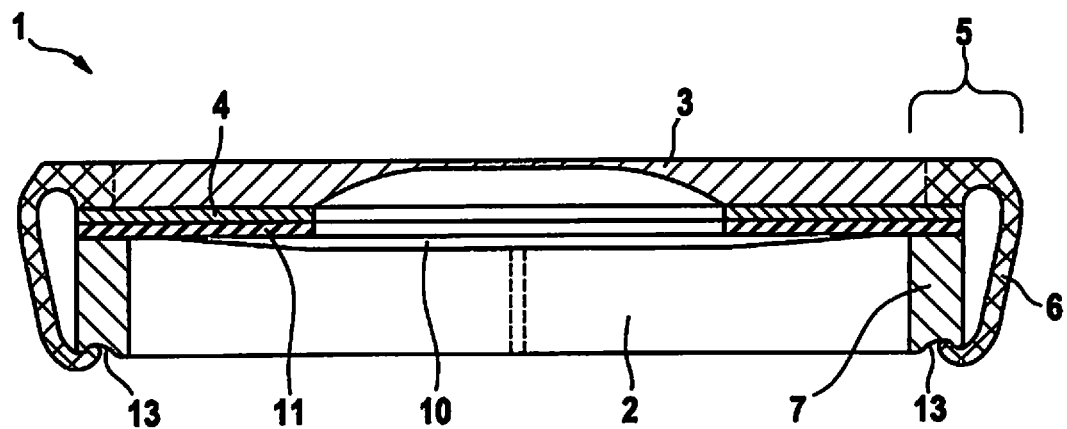
FIG. 2 shows a schematic view of an acoustic sensor in a second specific embodiment of the present invention.

FIG. 2 shows a schematic view of an acoustic sensor 1 according to a second specific embodiment of the present invention. A cross section of acoustic sensor 1 is shown.

In this second specific embodiment, carrier element 2 is a disk-shaped circuit board. On its disk-shaped surface facing diaphragm element 3, the disk-shaped circuit board (carrier element 2) includes a cavity 10. To that end, the circular surface of carrier element 2, which is situated on the first side, arches inward, which means that a depression is formed. In this context, a depth of the depression is selected so that it is possible for diaphragm element 3 to vibrate freely in response to excitation by electroacoustic transducer 4.

On a second side, which is a side opposite to the first side, carrier element 2 has a groove 13, which runs around the circular surface of the carrier element, on the second side, at its outer circumference.

At its outer circumference, thus, in its edge region 5, diaphragm element 3 includes a plurality of clip elements. These clip elements form retaining region 6. The parts of diaphragm element 3, which form retaining region 6, are resilient. During assembly of acoustic sensor 1, if diaphragm element 3 is pressed onto carrier element 2, then retaining region 5 of diaphragm element 3 widens, since it is elastic, and carrier element 2 may be inserted into the clips of diaphragm element 3. Thus, there is a snap-on connection between diaphragm element 3 and a subregion 7 of carrier element 2. In this context, subregion 7 of carrier element 2 is an outer circumference of carrier element 2. Groove 13 runs in subregion 7, on the second side of carrier element 2. The clip elements are shaped so as to have a region, which engages with groove 13 when diaphragm element 3 is connected to carrier element 2.

Since, in this second specific embodiment, carrier element 2 is a circuit board, electronics 9 for exciting acoustic transducer 4 are situated directly on carrier element 2, for example, on the second side of carrier element 2. In this case, electroacoustic transducer 4 is contacted via circuit traces, which are run from the second side of carrier element 2 to the first side of carrier element 2.

In this second specific embodiment, electroacoustic transducer 4 has an annular design. This includes an outer circumference, which corresponds to an outer circumference of the circular surface of carrier element 2. Sealing element 11 is situated between electroacoustic transducer 4 and carrier element 2; in this second specific embodiment, the sealing element being constructed annularly, as well, and its annular surface corresponding to the annular surface of electroacoustic transducer 4. Electroacoustic transducer 4 rests on diaphragm element 3. Sealing element 11 is situated between electroacoustic transducer 4 and carrier element 2.

Therefore, electroacoustic transducer 4 is held between diaphragm element 3 and carrier element 2. Thus, electroacoustic transducer 4 does not have to be attached separately to diaphragm element 3 or carrier element 2. A contact pressure on diaphragm element 3 is increased further by flexible sealing element 11.

As is apparent from FIG. 2, in the region that carrier element 2 covers, diaphragm element 3 has a thin spot, which lies within the ring that is traced by electroacoustic transducer 4. In this manner, a vibration resistance of diaphragm element 3 is minimized.

In this second specific embodiment, the height of carrier element 2 is so small, that the sections of diaphragm element 3 pointing inwards may grip carrier element 2 from behind. For example, diaphragm element 3 has a diameter of 16 mm. The edges of diaphragm element 3 grip carrier element 2 from behind and engage with mechanical grooves, which means that it is only possible to displace the edges, using a considerably higher force, since the diaphragm edges must be pushed out of the groove, as well. By way of example, the circuit board has a thickness of 2 mm.

FIG. 3 shows, in a third specific embodiment, a schematic view of a cross section of a portion of an acoustic sensor 1. The third specific embodiment corresponds substantially to the first or second specific embodiment described above. In this third specific embodiment, a snap-on connection is also formed by diaphragm element 3 and carrier element 2. In this case, the portion of diaphragm element 3, which snaps into carrier element 2, is constructed to be particularly pointed. In this context, constriction 12 has a side that is oblique with respect to the circumferential surface. In this manner, diaphragm element 3 is pressed onto carrier element 2, when, due to its elasticity, the retaining region exerts a pressure on this side of constriction 12.

Figure 3A:
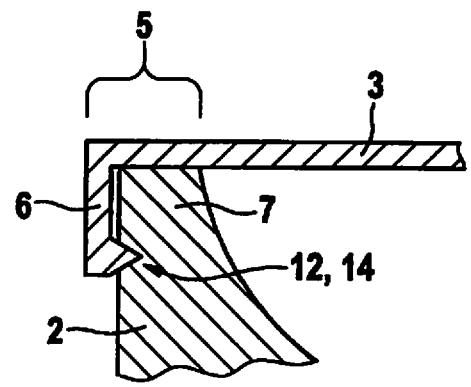
FIG. 3a shows a section of an acoustic sensor according to a third specific embodiment of the present invention.

With reference to FIG. 3a, an alternative specific embodiment of the present invention is likewise described, in which subregion 7 of the carrier element, which is embraced by retaining region 6, forms a course 14 of a thread. A cross section of an exemplary acoustic sensor 1, in which subregion 7 of carrier element 2 forms a course 14 of a thread, corresponds to the cross section shown in FIG. 3a, as well. In this context, however, a distance between the depression and the surface of carrier element 2 situated on the first side of carrier element 2 varies as a function of a selected crossing axis for the cross section. Consequently, diaphragm element 3 may be screwed onto carrier element 2. In this case, it is not absolutely necessary for retaining region 6 to be resilient. Therefore, diaphragm element 3 is screwed onto carrier element 2 as a cover, in a manner similar to a cover, which is screwed onto a jelly jar. To that end, retaining region 6 of diaphragm element 3 is formed to have a section, which is shaped in such a manner, that it engages with the course 14 of the thread. The course 14 of the thread may also have breaks in its path.

Figure 3B:
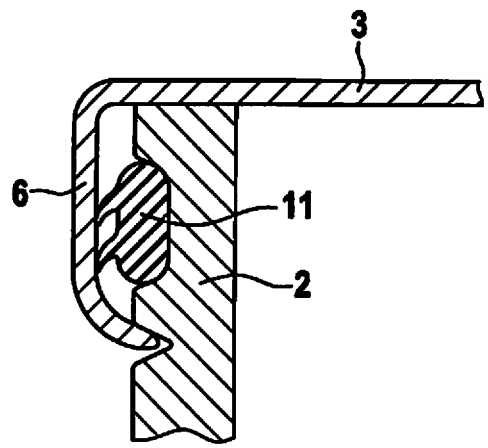
FIG. 3b shows a section of an acoustic sensor according to a fourth specific embodiment of the present invention.

FIG. 3b shows, in a fourth specific embodiment, a schematic view of a cross section of a portion of acoustic sensor 1. The fourth specific embodiment corresponds substantially to the specific embodiments described above. In this fourth specific embodiment, sealing element 11 is situated between carrier element 2 and diaphragm element 3, as in the first and second specific embodiments. In addition, carrier element 2 includes a cavity, in which sealing element 11 is situated. In this context, sealing element 11 is either an independent element, or is formed integrally with diaphragm element 3 or carrier element 2. In this fourth specific embodiment, the cavity, in which sealing element 11 is situated, is a depression, which runs around an outer circumference of carrier element 2.

Using its section directed inwards, the edge of diaphragm element 3 engages laterally, that is, on the side of the circumferential surface of carrier element 2, with a section of carrier element 2 pointed outwards; the sealing element 11 being pinched in the subregion of carrier element 2 embraced by the retaining region. In this specific embodiment, sealing element 11 is provided with sealing lips, which are preferably oriented obliquely in such a manner, that these scarcely obstruct diaphragm element 3 and carrier element 2 from being joined, in the manner of a barb. However, in the event of an attempt to separate diaphragm element 3 and carrier element 2, these oppose a movement.

At the location, at which the edge of diaphragm element 3 first comes into contact with the housing edge upon joining diaphragm element 3 and carrier element 2, the edge of carrier element 2 preferably has an insertion aid to facilitate overcoming the press fit.

Figure 3C:
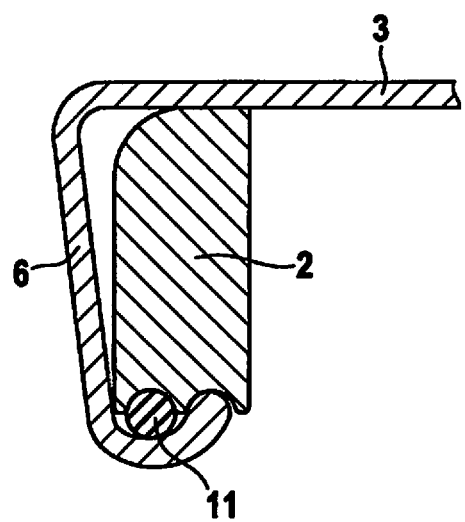
FIG. 3c shows a section of an acoustic sensor according to a fifth specific embodiment of the present invention.

FIG. 3c is a schematic view of a cross section of an acoustic sensor 1 according to a fifth specific embodiment of the present invention. This fifth specific embodiment of the present invention shows an alternative set-up of sealing element 11. In this case, sealing element 11 is situated in a cavity, which also runs around an outer circumference of carrier element 2, though on a side of carrier element 2 facing away from the first side.

In further alternative specific embodiments, diaphragm element 3 is made of a heat-shrinkable material and is shrunk onto carrier element 2 by thermal heating.

Together with the description above, reference is made explicitly to the disclosure of FIGS. 1 through 3c.

What is claimed is:

1. An acoustic sensor, comprising:
a carrier element;
a diaphragm element situated on a first side of the carrier element; and
an electroacoustic transducer which is situated on a side of the diaphragm element facing the carrier element;
wherein the electroacoustic transducer is configured to induce at least a region of the diaphragm element to vibrate, wherein at at least an edge region, the diaphragm element has a retaining region, which extends in the direction of the carrier element and embraces a subregion of the carrier element,
wherein the retaining region of the diaphragm element forms a connection with the subregion of the carrier element,
wherein first side of the carrier element has a disk-shaped surface,
wherein the carrier element has a cavity,
wherein the cavity has a variable depth over its course along the first side of the carrier element, and wherein the cavity is a circularly-shaped depression, and
wherein the depth changes both over a radius of the first side and along a circular direction of the first side, that is, azimuthally, so that on a left side of the carrier element the cavity has a depth different from a right side, so that acoustic waves, which are reflected in these different regions of the cavity, cover different distances, and so as to influence a directivity characteristic of the acoustic sensor.

2. The acoustic sensor as recited in claim 1, wherein the retaining region of the diaphragm element is resilient, and wherein the connection is a snap-on connection.

3. The acoustic sensor as recited in claim 1, wherein the subregion of the carrier element forms at least sections of a course of a thread, and the retaining region of the diaphragm element includes a section, which is formed so that it engages with the course of the thread.

4. The acoustic sensor as recited in claim 1, wherein the retaining region of the diaphragm element is made of a heat-shrinkable material, and the diaphragm element is joined to the carrier element by heating the diaphragm element.

5. The acoustic sensor as recited in claim 1, wherein the diaphragm element is at least partially elastic, and a dimension of diaphragm element is selected so that when the retaining region is embraced by the diaphragm element, a contact pressure is generated between the retaining region and the carrier element.

6. The acoustic sensor as recited in claim 1, wherein the cavity is situated on a side of the carrier element that is covered by the diaphragm element.

7. The acoustic sensor as recited in claim 1, wherein the carrier element includes a circuit board.

8. The acoustic sensor as recited in claim 1, wherein the carrier element includes a receptacle on a side facing away from the diaphragm element, and electronics for exciting the electroacoustic transducer being situated in the receptacle.

9. The acoustic sensor as recited in claim 1, wherein a sealing element is situated between the side of the diaphragm element facing the carrier element, and the carrier element.

10. The acoustic sensor as recited in claim 1, wherein the cavity is in the retaining region, the sealing element being situated in the cavity.

11. The acoustic sensor as recited in claim 1, wherein the sealing element is pinched in the subregion of the carrier element embraced by the retaining region, wherein the sealing element includes sealing lips, which are oriented obliquely in the manner of a barb.

12. The acoustic sensor as recited in claim 1, wherein the circularly-shaped depression runs around a center of the first side of the carrier element.

13. The acoustic sensor as recited in claim 1, wherein a circumferential surface of the carrier element includes a constriction, and wherein the constriction is a region, in which a radius of a solid cylinder, which forms a basic shape of the carrier element, is reduced.

14. The acoustic sensor as recited in claim 13, wherein the retaining region is formed such that at an outer circumference, the diaphragm element extends along the carrier element, parallel to a cylinder axis of the carrier element, and wherein after a distance, which extends at least to the constriction, the diaphragm element extends, in turn, parallel to a surface covering the carrier element, in a direction of a center of the carrier element, and therefore inward.

15. The acoustic sensor as recited in claim 14, wherein the retaining region of the diaphragm element extends at least so far in the direction of the center of the carrier element, that it reaches into the constriction, so that the cross section of the retaining region forms a U-shape in the edge region of the diaphragm element.

16. The acoustic sensor as recited in claim 1, wherein the diaphragm element covers the carrier element on the first side, wherein the diaphragm element does not rest directly on the carrier element and lies on a sealing element and the carrier element, and wherein the sealing element is situated between the side of the diaphragm element facing the carrier element.

17. The acoustic sensor as recited in claim 1, wherein the sealing element is a ring, which is made of an elastic material and which rests on the first side of the carrier element, wherein an inner circumference and an outer circumference of the sealing element are selected such that the sealing element rests in a region of the carrier element, which is situated outside of the cavity, so that the sealing element lies on the ridge, which is situated between the cavity and the circumferential surface of the carrier element.

18. The acoustic sensor as recited in claim 1, wherein an inner dimension of the diaphragm element is smaller than an outer dimension of the carrier element, wherein the diaphragm element is at least partially elastic, and wherein the dimensions of the diaphragm element are such that when the retaining region is embraced by the diaphragm element, there is a contact pressure between the retaining region and the carrier element.

19. The acoustic sensor as recited in claim 1, wherein the carrier element is a disk-shaped circuit board, wherein on the disk-shaped surface facing the diaphragm element, the disk-shaped circuit board includes a cavity, wherein a circular surface of the carrier element, which is situated on the first side, arches inward, so that a depression is formed, and wherein a depth of the depression is selected to allow the diaphragm element to vibrate freely in response to excitation by the electroacoustic transducer.

20. The acoustic sensor as recited in claim 1, wherein on a second side, which is a side opposite to the first side, the carrier element has a groove, which runs around the circular surface of the carrier element, on the second side, at its outer circumference.

21. The acoustic sensor as recited in claim 20, wherein at the outer circumference, in the edge region, the diaphragm element includes a plurality of clip elements that form the retaining region, wherein parts of the diaphragm element, which form the retaining region, are resilient, wherein the carrier element is insertable into the clips of the diaphragm element, so that there is a snap-on connection between the diaphragm element and a subregion of the carrier element.

* * * * *